US00RE44246E

(19) United States
(12) Reissued Patent
Heuvelman

(10) Patent Number: US RE44,246 E
(45) Date of Reissued Patent: May 28, 2013

(54) METHOD FOR CONTAINING A DEVICE AND A CORRESPONDING DEVICE

(75) Inventor: Willem Matthijs Heuvelman, Boxtel (NL)

(73) Assignee: Cavendish Kinetics Limited, Hertfordshire (GB)

(21) Appl. No.: 13/191,865

(22) Filed: Jul. 27, 2011

Related U.S. Patent Documents

Reissue of:

(64) Patent No.: 7,615,395
Issued: Nov. 10, 2009
Appl. No.: 11/474,490
Filed: Jun. 26, 2006

U.S. Applications:

(63) Continuation of application No. PCT/GB2004/005122, filed on Dec. 6, 2004.

(30) Foreign Application Priority Data

Dec. 24, 2003 (GB) ..... 0330010.0

(51) Int. Cl.
*H01L 21/00* (2006.01)

(52) U.S. Cl.
USPC ..... 438/52; 438/127; 257/E29.324

(58) Field of Classification Search
USPC ..... 438/50, 51, 106, 107, 113, 48, 52, 438/53, 127
See application file for complete search history.

(56) References Cited

U.S. PATENT DOCUMENTS

| | | | |
|---|---|---|---|
| 5,504,026 | A | 4/1996 | Kung |
| 5,861,344 | A | 1/1999 | Roberts et al. |
| 5,919,548 | A | 7/1999 | Barron et al. |
| 6,012,336 | A | 1/2000 | Eaton et al. |
| 6,174,820 | B1 | 1/2001 | Habermehl et al. |
| 6,174,850 | B1 | 1/2001 | Michaud |
| 6,635,509 | B1 | 10/2003 | Ouellet |
| 6,861,277 | B1 | 3/2005 | Monroe et al. |
| 6,936,494 | B2 | 8/2005 | Cheung |
| 7,008,812 | B1 | 3/2006 | Carley |
| 2001/0023991 | A1 | 9/2001 | Kakuhara |

(Continued)

FOREIGN PATENT DOCUMENTS

| | | |
|---|---|---|
| DE | 100 56 716 | 5/2002 |
| DE | 10056716 A1 | 5/2002 |

(Continued)

OTHER PUBLICATIONS

Notification of Reasons for Rejection dated Feb. 17, 2009 for Japanese Patent Application No. 2006-546296 (CK004JP) and English translation thereof.

(Continued)

*Primary Examiner* — Savitr Mulpuri
(74) *Attorney, Agent, or Firm* — Patterson & Sheridan LLP

(57) ABSTRACT

A method of enclosing a micromechanical element formed between a base layer and one or more metallization layers includes forming one or more encapsulating layers over the micromechanical element and providing an encapsulating wall surrounding the element extending between the base layer and the one or more encapsulating layers. An electrical connection is provided between the base layers and the one or more metallization layers formed above the micromechanical element.

30 Claims, 5 Drawing Sheets

U.S. PATENT DOCUMENTS

| | | | | |
|---|---|---|---|---|
| 2002/0011645 | A1 | 1/2002 | Bertin et al. | |
| 2002/0064906 | A1 | 5/2002 | Enquist | |
| 2002/0193037 | A1 | 12/2002 | Hofmann et al. | |
| 2003/0001221 | A1 | 1/2003 | Fischer et al. | |
| 2003/0148550 | A1 | 8/2003 | Volant et al. | |
| 2003/0153116 | A1 | 8/2003 | Carley et al. | |
| 2004/0020782 | A1 | 2/2004 | Cohen et al. | |
| 2004/0127008 | A1* | 7/2004 | Frey et al. | 438/602 |
| 2004/0157426 | A1 | 8/2004 | Ouellet et al. | |
| 2004/0159532 | A1 | 8/2004 | Tatic-Lucic et al. | |
| 2004/0166603 | A1 | 8/2004 | Carley | |
| 2004/0188785 | A1 | 9/2004 | Cunningham et al. | |
| 2004/0245588 | A1 | 12/2004 | Nikkel et al. | |
| 2005/0037608 | A1 | 2/2005 | Andricacos et al. | |
| 2005/0164127 | A1 | 7/2005 | Reid et al. | |
| 2006/0134825 | A1 | 6/2006 | DCamp et al. | |
| 2006/0220173 | A1 | 10/2006 | Gan et al. | |
| 2007/0235501 | A1 | 10/2007 | Heck | |
| 2009/0108381 | A1* | 4/2009 | Buchwalter et al. | 257/415 |

FOREIGN PATENT DOCUMENTS

| | | | |
|---|---|---|---|
| EP | 0 751 546 | | 1/1997 |
| EP | 751546 | A2 | 1/1997 |
| EP | 0 783 182 | | 7/1997 |
| EP | 783182 | A2 | 7/1997 |
| EP | 1 041 629 | | 10/2000 |
| EP | 1041629 | A1 | 10/2000 |
| EP | 1433740 | A1 | 6/2004 |
| EP | 1 450 406 | | 8/2004 |
| EP | 1 450 406 | A1 | 8/2004 |
| EP | 1450406 | A1 | 8/2004 |
| JP | 63-198378 | | 8/1988 |
| JP | 63-307758 | | 12/1988 |
| JP | 63-307758 | A | 12/1988 |
| JP | 05-297413 | | 11/1993 |
| JP | 09-257618 | | 10/1997 |
| JP | 11-177067 | | 7/1999 |
| JP | 2000-186931 | | 7/2000 |
| JP | 2001-133703 | | 5/2001 |
| JP | 2002-280470 | | 9/2002 |
| JP | 2003-035874 | | 2/2003 |
| JP | 2003-506871 | | 2/2003 |
| WO | WO 97/07517 | | 2/1997 |
| WO | WO-97/07517 | A2 | 2/1997 |
| WO | WO 00/24021 | | 4/2000 |
| WO | WO-00/24021 | A1 | 4/2000 |
| WO | WO 00/33089 | | 6/2000 |
| WO | WO-00/33089 | A2 | 6/2000 |
| WO | WO 01/31664 | | 5/2001 |
| WO | WO-01/31664 | A1 | 5/2001 |
| WO | WO 01/56066 | | 8/2001 |
| WO | WO-01/56066 | A1 | 8/2001 |
| WO | WO 01/83363 | | 11/2001 |
| WO | WO-01/83363 | A1 | 11/2001 |
| WO | WO 01/92842 | | 12/2001 |
| WO | WO-01/92842 | A2 | 12/2001 |
| WO | WO 02/16150 | | 2/2002 |
| WO | WO-02/16150 | A1 | 2/2002 |
| WO | WO 02/063657 | | 8/2002 |
| WO | WO-02/63657 | A2 | 8/2002 |
| WO | WO 03/028059 | | 4/2003 |
| WO | WO-03/028059 | A1 | 4/2003 |
| WO | WO 03/069645 | | 8/2003 |
| WO | WO-03/069645 | A1 | 8/2003 |
| WO | WO-03/085719 | | 10/2003 |
| WO | WO 2004/096696 | | 11/2004 |
| WO | WO-2004/096696 | A1 | 11/2004 |
| WO | WO 2005/060002 | | 6/2005 |
| WO | WO-2005/060002 | A1 | 6/2005 |
| WO | WO 2005/061376 | | 7/2005 |
| WO | WO-2005/061376 | A1 | 7/2005 |
| WO | WO 2007/015097 | | 2/2007 |
| WO | WO-2007/015097 | A1 | 2/2007 |
| WO | WO 2007/017672 | | 2/2007 |
| WO | WO-2007/017672 | A1 | 2/2007 |
| WO | WO 2007/060414 | | 5/2007 |
| WO | WO-2007/060414 | A1 | 5/2007 |
| WO | WO 2007/060416 | | 5/2007 |
| WO | WO-2007/060416 | A1 | 5/2007 |

OTHER PUBLICATIONS

Notification of the First Office Action for Chinese Patent Application No. 200480039028.0 (CK004-China) dated Feb. 27, 2009.

Office Action for European Patent Application No. 04805944.8 dated Jun. 22, 2009 (CK004EP).

Chan, et al., "Comprehensive Static Characterization of Vertical Electrostatically Actuated Polysilicon Beams", vol. 16, No. 4, Oct. 1999, pp. 58-65.

International Preliminary Report and Written Opinion for International Application No. PCT/GB2006/2959 dated Feb. 5, 2008.

International Preliminary Report and Written Opinion for International Application No. PCT/GB2006/004350 dated May 27, 2008.

International Preliminary Report and Written Opinion for International Application No. PCT/GB2006/004354 dated May 27, 2008.

International Preliminary Report on Patentability for International Application No. PCT/GB2004/005122 dated Nov. 16, 2005.

International Preliminary Report on Patentability for International Application No. PCT/GB2004/001773 dated Jun. 22, 2008.

International Search Report for International Application No. PCT/GB2006/004354 dated Mar. 12, 2007.

International Search Report for International Application No. PCT/GB2006/002959 dated Oct. 25, 2006.

International Search Report for International Application No. PCT/GB2006/004350 dated Mar. 12, 2007.

International Search Report for International Application No. PCT/GB2004/005122 dated Mar. 2, 2005.

International Search Report for International Application No. PCT/GB2004/001773 dated Sep. 6, 2004.

Mercado et al., "A mechanical approach to overcome RF MEMS switch stiction problem", vol. conf. 53, dated May 27, 2003, pp. 377-384.

Written Opinion for International Application No. PCT/GB2004/005122 dated Feb. 28, 2005.

Zavracky et al., "Micromechanical Switches Fabricated Using Mickel Surface Micromachining", Journal of Microelectromechanical Systems, IEEE Service Center, Piscataway, NJ, US, vol. 6, No. 1, dated Mar. 1997.

Stahl, et al. "Thin film encapsulation of acceleration sensors using polysilicon sacrificial layers" vol. 22, dated Jun. 9, 2003, pp. 1899-1902.

Written Opinion for International Application No. PCT/GB2004/001773 dated Sep. 6, 2004.

Search report and written opinion for PCT/US2009/033927 (CK051PCT) dated Jan. 7, 2010.

Chinese office action dated Feb. 25, 2010 for Chinese Patent Application No. 200480039028.0 (CK004CN).

Chinese Office Action dated Jul. 21, 2010 for Chinese Patent Application No. 200480039028.0 (CK004CN).

Japanese office action dated Feb. 23, 2010 for Japanese Patent Application No. 2006-546296 (CK004JP).

H. Stahl, et al., "Thin Film Encapsulation of Acceleration Sensors Using Polysilicon Sacrificial Layers," IEEE, pp. 1899-1902.

Chan, et al. "Comprehensive Static Characterization of Vertical Electrostatically Actuated Polysilicon Beams" vol. 16, No. 4, dated Oct. 1999, pp. 58-65.

International Preliminary Report and Written Opinion for International Application No. PCT/GB2006/002959 dated Feb. 5, 2008.

International Search Report for International Application No. PCT/GB2004/005122 dated Mar 2, 2005.

Mercado, et al. "A mechanical approach to overcome RF MEMS switch stiction problem" vol. conf. 53, dated May 27, 2003, pp. 377-384.

Written Opinion of the International Searching Authority for International Application No. PCT/GB2004/005122 dated Feb. 28, 2005.

Zavracky, et al. "Micromechanical Switches Fabricated Using Nickel Surface Micromachining" Journal of Microelectromechanical Systems, IEEE Service Center, Piscataway, NJ, US, vol. 6, No. 1, dated Mar. 1997.

* cited by examiner

METHOD FOR CONTAINING A DEVICE AND A CORRESPONDING DEVICE

Matter enclosed in heavy brackets [ ] appears in the original patent but forms no part of this reissue specification; matter printed in italics indicates the additions made by reissue.

CROSS REFERENCE TO RELATED APPLICATIONS

This application is a continuation of PCT/GB04/05122, filed Dec. 6, 2004, and titled "Method for Containing a Device and a Corresponding Device," which claims priority to Great Britain Patent Application No. GB 0330010.0, filed on Dec. 24, 2003, and titled "Method for Containing a Device and a Corresponding Device," the entire contents of which are hereby incorporated by reference.

FIELD OF THE INVENTION

The present invention relates to the encapsulation of micromechanical elements for use, in particular, but not exclusively, in semiconductor devices.

BACKGROUND

In recent years, the potential has escalated for the use of micromechanical elements in a variety of technical arenas such as semiconductor devices. Typically the micromechanical elements are integrated into semiconductor devices, and are housed in cavities or voids formed upon or within, for example, a complimentary metal oxide semiconductor (CMOS) device. While integrating the micromechanical element onto the CMOS substrate, it is equally important to provide adequate environmental protection for the micromechanical elements, and provide electrical connection to the upper layers of the circuit.

The micromechanical element could be moveable or non-moveable, for example, a charge transfer device movable between electrodes or a microfuse element which blows on the application of a suitable current. One of the principal concerns facing the micro-electromechanical systems (MEMS) industry is that the micromechanical elements are highly sensitive to their operational environments which include thermal, chemical and mechanical exposure which may be detrimental to the performance of the semiconductor device. Hence, it is desirable to provide such micromechanical elements with some form of protective seal or seals.

The device incorporating the micromechanical element may equally become damaged, for example, while being handled during subsequent packaging steps or to provide electrical connection to the upper circuit; hence, the need for suitable protection.

It can be appreciated that micromechanical elements require stringent measures of protection, therefore, it is an object of the present invention to provide reliable an enclosure for the micromechanical element in the form of hermetic seals, without increasing the size and cost of the devices. It can be seen therefore, that there is a need to fabricate reliable micromechanical elements for use in semiconductor devices.

SUMMARY

The present invention provides environmental protection for sensitive micromechanical elements, such as fuses or charge transfer elements, via hermetic layers formed above the elements while being integrated with the CMOS portions of the device. Additional sealing is provided laterally relative to the plane of the encapsulating layers by forming lateral walls embedded within the CMOS and encapsulating layers of the device.

This type of encapsulation is particularly advantageous as the protected micromechanical devices can be integrated into CMOS processes in every metallization sequence, other than the last metallization layer. The present invention permits the micromechanical element to be formed closer to the CMOS transistor levels of the device. This is particularly so since the base layers within which the micromechanical element is integrated tend to become thicker in the metallization steps far removed from the CMOS transistor levels.

An advantage of the present invention is that the encapsulation process of the present invention lends itself to standard CMOS processing. The formation of such devices is contingent upon the provision of traditional and modern industrial processes, for example, it is necessary that the planarizing steps include chemical mechanical processing (CMP). This technique is commonly used to planarize insulating and metal layers during the fabrication of a semiconductor device.

Therefore, according to the present invention, there is provided a method of enclosing a micromechanical element formed between a base layer and one or more metallization layers comprising: forming one or more encapsulating layers over the micromechanical element; providing an encapsulating wall surrounding the element extending between the base layer and the one or more encapsulating layers; and providing electrical connection between the base layers and the one or more metallization layers formed above the micromechanical element. The method may further comprise: depositing one or more encapsulating layers over at least part of the micromechanical element; planarizing the one or more encapsulating layers; forming one or more openings in the one or more encapsulating layers; applying one or more sacrificial layers contacting the micromechanical element; and removing the one or more sacrificial layers to expose the micromechanical element within a cavity.

The one or more openings formed in the one or more encapsulating layers may be exposed using dry etching.

Advantageously, the planarizing may recede the one or more encapsulating layers closer to the one or more sacrificial layers, and is carried out using chemical-mechanical polishing (CMP).

The one or more sacrificial layers may comprise different forms of the same materials or comprise different materials.

The one or more sacrificial layers may comprise an etchable Silicon-based material such as silicon nitride, silicon oxide or amorphous silicon. The materials may be etchable using fluorine-based compounds.

Advantageously, the one or more encapsulating layers may be formed from silicon-based materials such as silicon oxide, or silicon nitride.

One or more sacrificial layers can be deposited using plasma enhanced chemical vapor deposition (PECVD).

The operation of removing the one or more sacrificial layers can include introducing an etchant through the one or more openings in the one or more encapsulating layers.

The one or more sacrificial layers may comprise an etchable polymer-based material such as polyimide, which may be etched using an oxygen plasma.

The walls may be formed from one or more stacked plugs. Further, the plugs may also provide electrical connection between the base layer and the uppermost metallization layers of the underlying the micromechanical element.

Advantageously, the wall members may extend through the dielectric layer and the encapsulating layers.

In another aspect of the present invention, there is provided, a semiconductor device comprising: a micromechanical element formed on a base layer; one or more encapsulating layers disposed over the micromechanical element and an encapsulating wall surrounding the micromechanical element extending from the base layer into the one or more encapsulating layers.

In yet a further aspect of the present invention, there is provided a method of forming a micromechanical element comprising: providing a base layer that may be patterned; applying one or more sacrificial layer of an etchable material; patterning the one or more sacrificial layer to define at least a portion of the shape of the element; applying at least one layer defining a mechanical material; patterning the micromechanical element to form at least a portion of the element; and removing part of sacrificial layer to at least partly free the element.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Embodiments of the present invention will now be described, by way of example only, with reference to the accompanying drawings in which.

DETAILED DESCRIPTION

Figure 1:
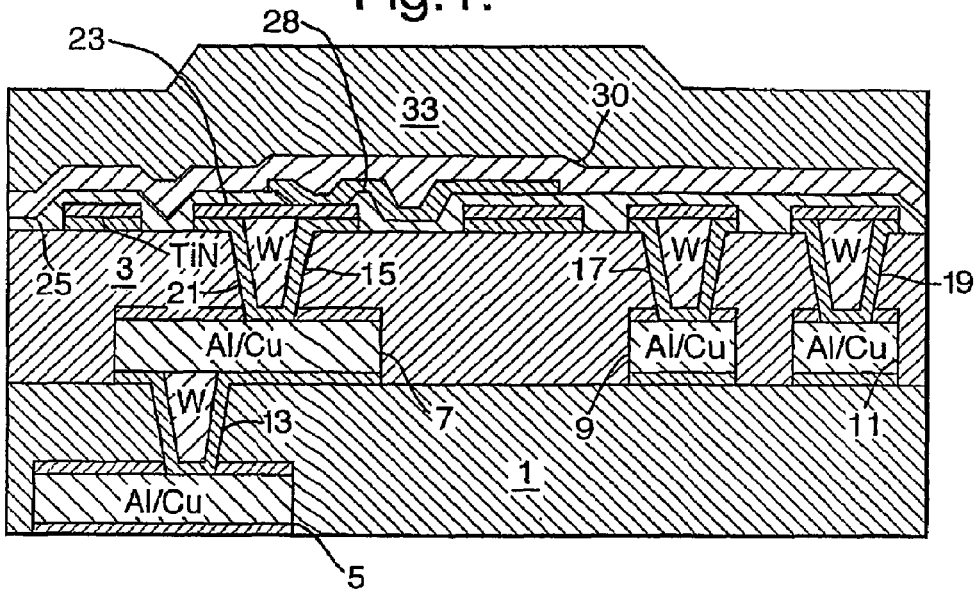
FIG. 1 shows a cross section of the device after forming the micromechanical element and depositing the first encapsulating layer.

FIG. 1 shows the device of the present invention embodied in the standard CMOS starting base layers, which would be familiar to those skilled in the art, within which the micromechanical element is formed comprising: base layer 1, which would be disposed on the CMOS transistor levels (not shown); dielectric 3, metal interconnects 5, 7, 9, 11 and via plugs formed at 13, 15, 17, 19 for providing electrical contact between the CMOS substrate layers beneath the base layers 1, the micromechanical element 28 integrated thereon and contacts to the upper metal interconnect layers.

Referring to FIG. 1, the plugs 13, 15, 17, 19 are formed using standard CMOS processes, for example, the tungsten plugs 15, 17, and 19 are formed by etching a via which is lined with TiN liner 21, for example, of a predetermined thickness and subsequently deposited with a tungsten (W) filling. Surplus W deposited over a substantial part of the device is etched back to the TiN layer 21 as shown. This is followed by capping over the device a second TiN layer 23 which is patterned together with TiN layer 21 and selectively etched back to the dielectric layer 3 as shown.

Portions of the TiN layer 23 together with TiN layer 21 will form contacts and/or electrodes for enabling operation of the device 100. Next a first sacrificial layer 25, for example Silicon Nitride, is deposited over the dielectric 3 and TiN layer 23 overlaying the TiN layer 21 followed by selective etching thereof.

Again referring to FIG. 1, material forming the micromechanical element 28 is deposited in the next layer over the device 100, which is selectively patterned and etched to define the structure of the micromechanical element 28. Once the micromechanical element 28 has been formed, and before the micromechanical element 28 is released, additional process sequences are introduced to initiate the encapsulation stages of the micromechanical element.

A second sacrificial layer 30 is deposited over the layer comprising the micromechanical element 28 and the first sacrificial layer 25 as shown in FIG. 1. The second sacrificial layer 30 which is amenable to physical or chemical vapor deposition technology is applied on the TiN layer 23 using Plasma Enhanced Chemical Vapor Deposition (PECVD) or other conventional methods known to the skilled person in the art. The sacrificial layer 30 may preferably be formed from silicon-based materials such as silicon nitride, silicon oxide, amorphous silicon or spin on glass (SOG) materials.

The sacrificial layer 30 should be selected so as to have the desired properties, for example, the etchable material should permit isotropic or non-isotropic etching and should not impose unfavorable reactions with sensitive micromechanical elements.

Further silicon nitride or polyimide could be used for the both the first sacrificial layer 25 and second sacrificial layer 30. A hydrogen-rich silicon nitride layer can increase the etch rate, for example, the different hydrogen contents in the silicon nitride can make the etch rate change by a factor of ten. Hydrogen content can be controlled by controlling the silane and ammonia ratios during plasma processing of the layer.

To provide a hermetic seal so as to protect the micromechanical element 28 from environmental exposure, a first encapsulating layer 33 is deposited on the device.

This operation involves an oxide deposition process to apply on the second sacrificial layer 30 a micromachinable insulating material such as Silicon Oxide. Preferably, the oxide forming the first encapsulating layer is deposited using Chemical Vapor Deposition (CVD), which substantially covers micromechanical element 28, as shown in FIG. 1.

According to one aspect of the invention, the uneven surface topography resulting from the previous step as shown in FIG. 1 is further processed. In a next step, chemical-mechanical polishing (CMP), which provides a rapid and effective method for substantially planarizing topographies, is used to recede the first encapsulating layer 33 to a predetermined level spaced from the sacrificial layer 30. CMP may be readily applied at any level in the deposition procedures described herein. Moreover, the use of CMP at this stage of the invention on the first encapsulating layer 33 enables the encapsulation method of the present invention to be integrated into the CMOS in every metallization sequence, in particular closer to the base layer.

Figure 2:
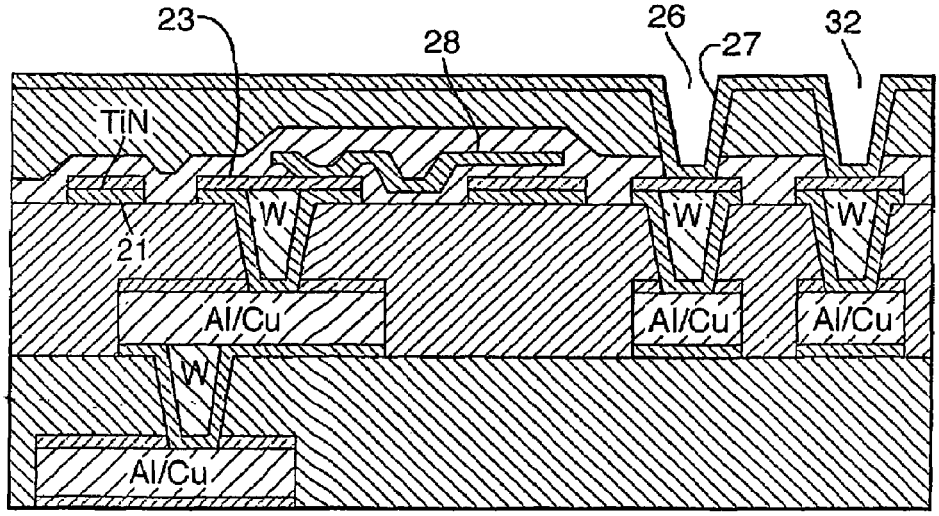
FIG. 2 shows a cross section of the device after planarization of the first encapsulation layer followed by via formation through the first encapsulation layer.

In the next stage, at least part of the device of FIG. 1 is masked so as to permit the formation of via 26 and via 32 on the right hand side of the micromechanical element shown in the FIG. 2. In this step, a tungsten plug is introduced which can also be used to make a lateral seal ring around the micromechanical element 28.

As shown in FIG. 2, a masking step is implemented to etch via 26 and via 32 through a portion of the CMP-treated first encapsulation layer 33 and second sacrificial layer 30, followed by the deposition of (to provide a conducting path between electrical contacts which may lie above and below the oxide layer) a TiN lining 27 for the via 26 and via 32. The openings are etched by a technique incorporating a plasma.

Figure 3:
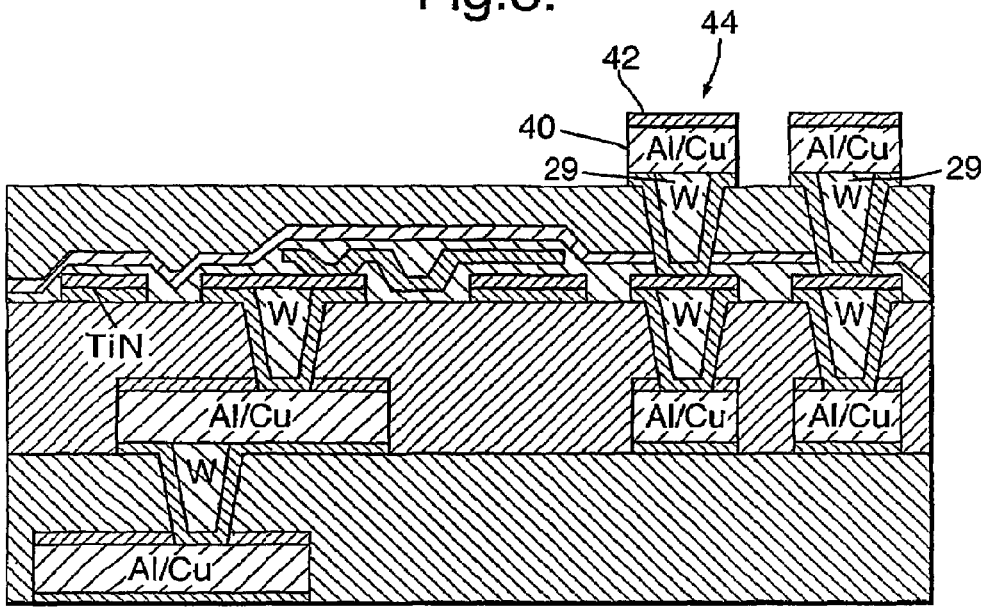
FIG. 3 shows a cross section of the device incorporating on the tungsten plugs a conducting layer and TiN contact layer.

In a next step, the TiN-lined vias are filled with tungsten deposited by CVD to form via plugs 28, 29, and again the superfluous material may be dry etched or planarized using CMP to the aforementioned predetermined level spaced from the sacrificial layer 30, as shown in FIG. 3. CMP may be effective in removing any excess W or TiN filling encroaching above the vias, thereby planarizing the excess filling deposit so that it is level with the surface of the oxide forming the first encapsulating layer 33. It is important to prevent accidental removal of the W filling material from inside the vias as this may interfere with subsequent deposition steps and impair electrical contact.

Referring to FIG. 3, in a next step, the Aluminum (Al)/copper (Cu) metallization layer 40 is applied over the device by further patterning and etching stages so as to form a conducting layer 42 over the W plugs 29, as shown in FIG. 3. Metallization layer 40 is deposited further with an additional thin film of contact metal 42, made from TiN, to promote good electrical contact. This layer is patterned and etched using techniques that would be familiar to the skilled in the art.

In the present invention, FIG. 3 shows that a wall 44 comprising the tungsten plugs is formed around the micromechanical element 28, while the tungsten plugs and the interconnecting layers applied thereon serve to form the metal interconnects which permit electrical connection between the upper and lower layers of the device, and the underlying CMOS transistor levels.

Figure 4:
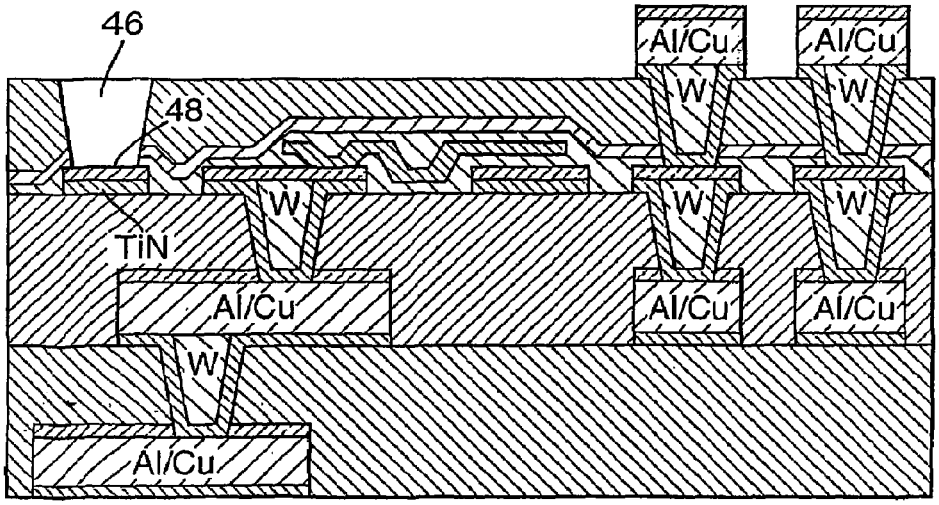
FIG. 4 shows a cross section of the device wherein an opening is formed in the first encapsulation layer, with the formation of the opening impeded by the stop layer.

In a next step, represented in the cross section of FIG. 4, first encapsulation layer 33 (LHS) is patterned using a mask so as to etch an opening 46 which is exposed by etching through the oxide encapsulation layer 33 and partially through the second sacrificial layer 30 until further etching of the opening 46 is impeded at a barrier 48, composed of TiN, formed during the micromechanical element formation described hereinbefore. Typically, the etching step is effected by a technique incorporating a plasma. The TiN barrier should be sufficiently inert to the etching step so as to prevent the etching of an opening through the underlying dielectric layer 3, which would be detrimental to the performance of the device.

Figure 5:
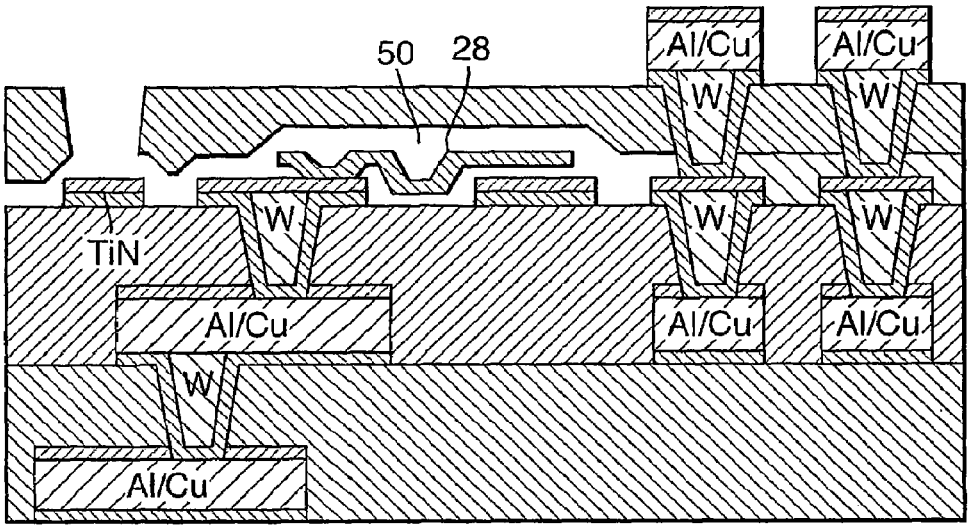
FIG. 5 shows a cross section of the device in which the micromechanical element is released by exposing the sacrificial layers to a release etch passed through the opening, the release being effected up to the encapsulating wall.

In a further step shown in FIG. 5, an etch release process step frees the micromechanical element 28 such that, in use, it is operable within cavity 50. Introducing an etching agent through opening 46 effects the removal of the first sacrificial layer 25 and second sacrificial layer 30 so as to free the micromechanical element 28. The removal of the sacrificial layer 25 and sacrificial layer 30 involve a dry etching process such as a fluorine-based etch like SF6. FIG. 5 shows that the wall 44 formed from tungsten plugs has a two fold function: it prevents the etching substances from releasing the micromechanical element 28 beyond the wall 44 and it forms a lateral sealing wall surrounding the micromechanical element 28. The latter provides protection for the micromechanical element in its operating environment or alternatively could be an additional electrode above the micromechanical element 28.

It is important that the structural integrity of the micromechanical element 28 is not impaired owing to detrimental reaction of the etching agent with the micromechanical element 28. This is achieved by selecting suitable chemically compatible materials and conditions of the release etch process and the equipment in which the process is carried out.

Figure 6:
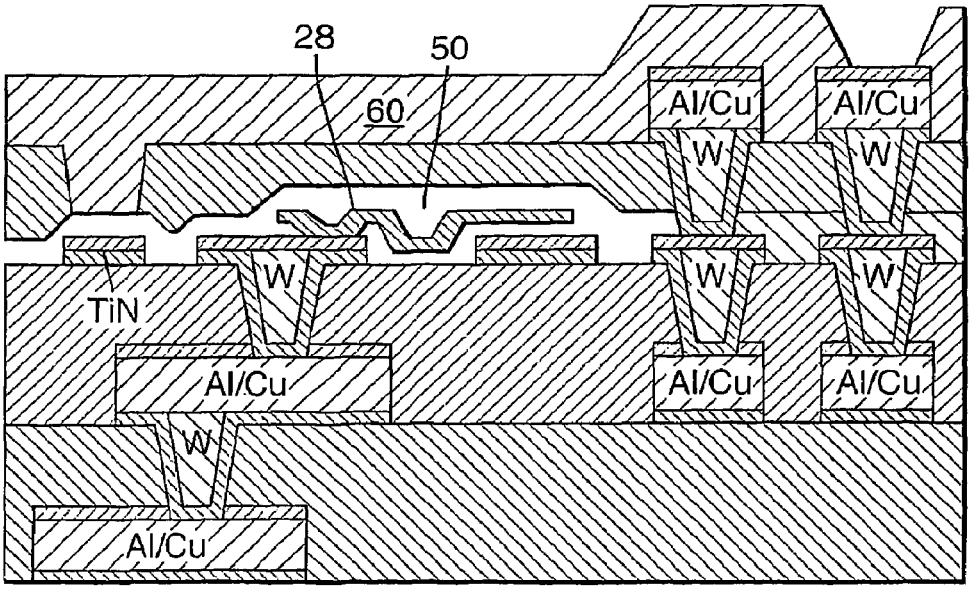
FIG. 6 shows a cross section of the device in which a second encapsulation layer is deposited over the device.

In a next step shown in FIG. 6, a second encapsulation layer 60 is deposited over the device, namely over the first encapsulation layer and the metallization portion 42 so as to provide a further hermetic seal. The second encapsulating material may be selected from a nitride material, for example silicon nitride. Given the relative sizes of the openings 46 (FIG. 5) and the cavity 50 containing the micromechanical element 28, the deposition conditions for applying the silicon nitride layer 60 are controlled so as to ensure that the hole is plugged. In particular, the opening 46 is far removed from the micromechanical element so as to prevent deposition thereon.

Figure 7:
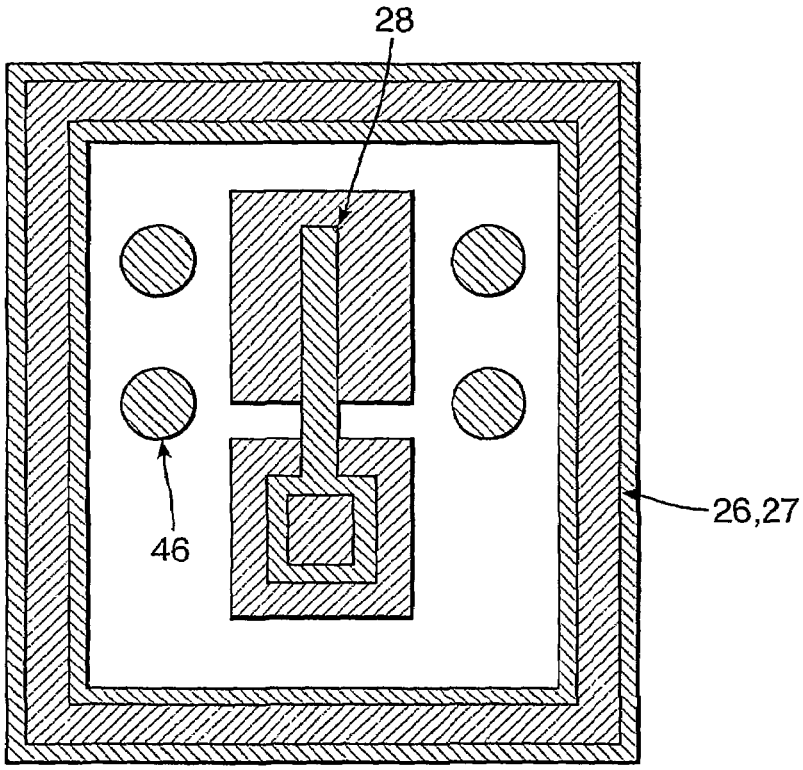
FIG. 7 shows a plan view of the device according to the present invention wherein the encapsulating wall forms a lateral enclosure surrounding the micromechanical element.

FIG. 7 shows a plan view of an embodiment of the present invention, wherein the wall 44 is disposed laterally to surround the micromechanical element 28. Release of the micromechanical element 28 is effected, for example, by passing the etchant through the release opening 46.

Figure 8A:
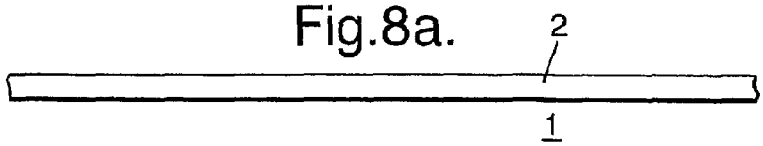
FIGS. 8a-8g show schematics of the different steps applied to form a micromechanical element for which encapsulation may be provided.

FIGS. 8a-8g show schematics of the different steps applied to form a micromechanical element for which encapsulation may be provided. Referring to FIG. 8a, In a first step a conducting layer 2 of nitrogen-rich titanium nitride is deposited on substrate 1. This can be achieved using reactive sputtering.

Figure 8B:
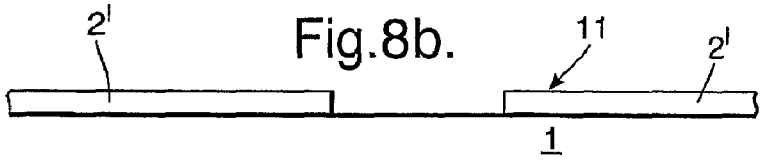

In a second step, depicted in FIG. 8b, the conducting layer 2 is patterned and etched by techniques that are normal in the micro-electronics industry using process equipment commonly available in most semiconductor fabrication facilities. Thus, a non-moveable lower first electrode 11 is formed.

Figure 8C:
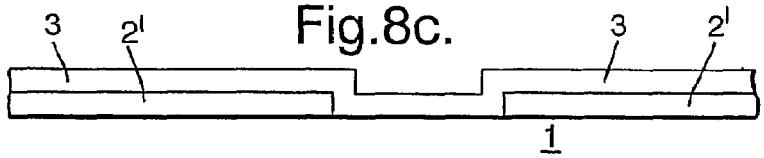

In a third step, depicted in FIG. 8c, a sacrificial layer 3 of a silicon-based material is deposited on the patterned conductive layer 2', possibly after a special surface treatment of the conductive layer 2 or the patterned conductive layer 2'. Amorphous silicon or silicon nitride may be used, or any other silicon-based material that has suitable properties, specifically including sputtered amorphous silicon and silicon nitride deposited by PECVD (Plasma-Enhanced Chemical Vapor Deposition). Furthermore, an etch process exists that can etch these materials isotropically or near isotropically, selectively with respect to titanium nitride with a limited and controlled amount of etch into the titanium nitride material.

Figure 8D:
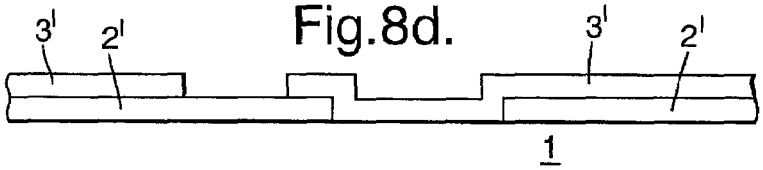

In a fourth step, depicted in FIG. 8d, the sacrificial layer 3 is patterned and etched by techniques that are normal in the micro-electronics industry using process equipment commonly available in most semiconductor fabrication facilities.

Figure 8E:
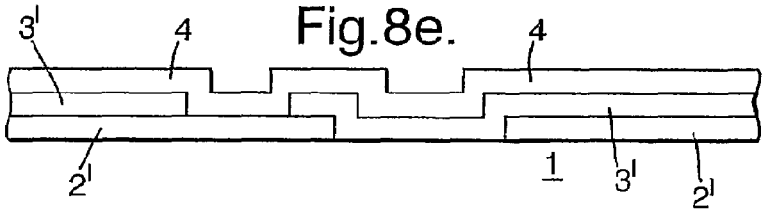

In a fifth step shown in FIG. 8e, structural layer 4 of Nitrogen rich titanium nitride is deposited on the patterned sacrificial layer, preferably using bias sputtering so as to control the properties of the conducting layer 2. Further, deposition may be controlled so as to achieve good electrical contact between the patterned conducting layer 2' and the structural layer 4' where these two layers make contact in the completed micromechanical element 10.

Figure 8F:
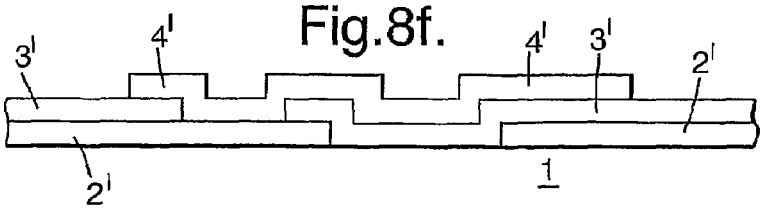
Figure 8G:
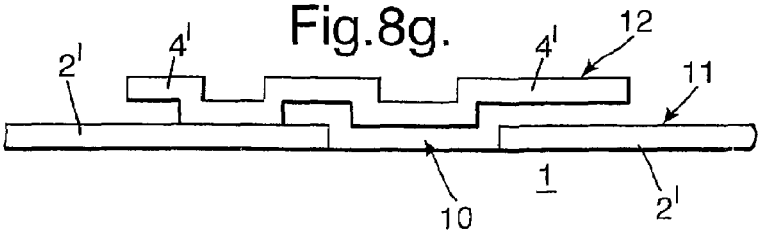

In a sixth step shown in FIG. 8f, the structural layer 4 is patterned and etched in a manner similar to that described in the second step. In a seventh step, shown in FIG. 8g, the element 10 is partially released by etching away the patterned sacrificial layer 3' in a plasma etch system using fluorine-based etch. The plasma system may be of a dual radio frequency system.

The skilled artisan will appreciate that the present invention may be applied for encapsulating movable and non-movable micromechanical elements such as a fuse, switches or other charge transfer elements operable within a cavity.

Having described preferred embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A method of enclosing a micromechanical element formed between a base layer and one or more metallization layers comprising:

forming a first encapsulating layer over at least part of the micromechanical element;

depositing a second encapsulating layer over the first encapsulating layer and providing an encapsulating wall surrounding the micromechanical element to form a lateral sealing wall extending between the base layer and the one or more encapsulating layers;

depositing the one or more metallization layers over the first encapsulating layer;

providing electrical connection between the base layer and the one or more metallization layers formed above the micromechanical element;

etching through the first encapsulating layer and a sacrificial layer disposed therebelow to form an opening through the first encapsulating layer and the sacrificial layer;

introducing an etching agent through the opening; and removing the sacrificial layer, wherein the micromechanical element is disposed in a cavity that is at least partially bordered by the encapsulating wall.

2. The method according to claim 1, wherein the encapsulating wall comprises a via filled with tungsten.

3. The method according to claim 1, wherein the encapsulating wall comprises a via that is lined with TiN and filled with tungsten.

4. The method according to claim 3, wherein the encapsulating wall provides an electrical connection between the base layer and the one or more metallization layers.

5. The method according to claim 1, wherein the encapsulating wall extends through the base layer and the first and second encapsulating layers.

6. The method according to claim 1, wherein the encapsulating wall is formed from one or more stacked plugs.

7. The method according to claim 6, wherein the one or more stacked plugs provide electrical connection between the base layer and the one or more metallization layers.

8. The method according to claim 7, wherein the one or more stacked plugs comprises a TiN liner and tungsten fill.

9. A method of forming and enclosing a micromechanical element between a base layer and one or more metallization layers, comprising:

applying a first sacrificial layer of an etchable material over at least a portion of the base layer;

patterning the first sacrificial layer to define at least a portion of the shape of the micromechanical element;

applying at least one layer of a micromechanical element material over at least a portion of the first sacrificial layer;

patterning the micromechanical element material to form at least a portion of the micromechanical element;

applying a second sacrificial layer of an etchable material over the micromechanical element;

applying a first encapsulating layer over at least a portion of the second sacrificial layer;

depositing a second encapsulating layer over the first encapsulating layer and providing an encapsulating wall surrounding the micromechanical element to form a lateral sealing wall extending between the base layer and the one or more encapsulating layers;

depositing the one or more metallization layers over the first encapsulating layer;

providing electrical connection between the base layer and the one or more metallization layers;

etching through the first encapsulating layer and the second sacrificial layer to form an opening through the first encapsulating layers and the second sacrificial layer;

introducing an etching agent through the opening; and removing at least part of the first and second sacrificial layers to at least partly free the micromechanical element, wherein the micromechanical element is disposed in a cavity that is at least partially bordered by the encapsulating wall.

10. The method according to claim 9, wherein the first and second sacrificial layers comprise an etchable silicon-based material.

11. The method according to claim 9, wherein the first and second sacrificial layers comprise an etchable polymer-based material.

12. The method according to claim 9, wherein the first or second sacrificial layers comprise an etchable silicon-based material.

13. The method according to claim 9, wherein the first or second sacrificial layers comprise an etchable polymer-based material.

14. The method according to claim 9, further comprising planarizing the first encapsulating layer.

15. The method according to claim 14, wherein the planarizing comprises chemical-mechanical polishing.

16. The method according to claim 9, wherein the encapsulating wall comprises a via filled with tungsten.

17. The method according to claim 9, wherein the encapsulating wall comprises a via that is lined with TiN and filled with tungsten.

18. The method according to claim 9, wherein the encapsulating wall extends through the base layer and the one or more encapsulating layers.

19. The method according to claim 9, wherein the encapsulating wall provides an electrical connection between the base layer and the one or more metallization layers.

20. The method according to claim 9, wherein the encapsulating wall is formed from one or more stacked plugs.

21. The method according to claim 20, wherein the one or more stacked plugs provide electrical connection between the base layer and the one or more metallization layers.

22. The method according to claim 21, wherein the one or more stacked plugs comprises a TiN liner and tungsten fill.

*23. A method of enclosing a micromechanical element, comprising:*

*forming a first encapsulating layer over at least part of the micromechanical element;*

*depositing a second encapsulating layer over the first encapsulating layer and providing an encapsulating*

*wall surrounding the micromechanical element to form a lateral sealing wall extending between the base layer and the one or more encapsulating layers;*

*depositing one or more metallization layers over the first encapsulating layer to provide an electrical connection between the base layer and the one or more metallization layers formed above the micromechanical element; and*

*freeing the micromechanical element disposed between the one or more metallization layers and the base layer, the freeing comprising:*

*etching through the first encapsulating layer and a sacrificial layer disposed therebelow to form an opening through the first encapsulating layer and the sacrificial layer;*

*introducing an etching agent through the opening; and*

*removing the sacrificial layer, wherein the micromechanical element is disposed in a cavity that is at least partially bordered by the encapsulating wall.*

*24. The method according to claim 23, wherein the encapsulating wall comprises tungsten.*

*25. The method according to claim 23, wherein the encapsulating wall comprises titanium nitride.*

*26. The method according to claim 25, wherein providing the encapsulating wall comprises forming the encapsulating wall between the base layer and the one or more metallization layers to provide an electrical connection therebetween.*

*27. The method according to claim 23, wherein providing the encapsulating wall comprises forming the encapsulating wall to extend through the base layer and the first and second encapsulating layers.*

*28. The method according to claim 23, wherein providing the encapsulating wall comprises forming one or more stacked plugs.*

*29. The method according to claim 28, wherein forming the one or more stacked plugs comprises forming the one or more stacked plugs to provide an electrical connection between the base layer and the one or more metallization layers.*

*30. The method according to claim 29, wherein forming the one or more stacked plugs comprises forming a titanium nitride liner and a tungsten fill.*

* * * * *